(12) United States Patent
Kuhlmann

(10) Patent No.: US 6,713,795 B2
(45) Date of Patent: Mar. 30, 2004

(54) PHOTODETECTOR FOR ULTRAVIOLET LIGHT RADIATION

(75) Inventor: Werner Kuhlmann, München (DE)

(73) Assignee: Osram Opto Semiconductor GmbH & Co. OHG, Regensburg (DE)

( * ) Notice: Subject to any disclaimer, the term of this patent is extended or adjusted under 35 U.S.C. 154(b) by 149 days.

(21) Appl. No.: 10/060,466

(22) Filed: Jan. 30, 2002

(65) Prior Publication Data

US 2002/0096728 A1 Jul. 25, 2002

Related U.S. Application Data

(63) Continuation of application No. PCT/DE00/02462, filed on Jul. 28, 2000.

(30) Foreign Application Priority Data

Jul. 30, 1999 (DE) .......................... 199 36 000

(51) Int. Cl.[7] .............................. A01L 31/062
(52) U.S. Cl. ................. 257/290; 250/370.11; 250/372; 250/373; 257/292; 257/432
(58) Field of Search ............. 250/370.11, 372, 250/373; 257/290, 292, 432

(56) References Cited

U.S. PATENT DOCUMENTS

| | | | |
|---|---|---|---|
| 4,096,387 A | | 6/1978 | Buckley |
| 4,910,570 A | * | 3/1990 | Popovic ...................... 257/290 |
| 5,434,418 A | * | 7/1995 | Schick ................... 250/370.11 |
| 5,442,179 A | * | 8/1995 | Ohishi ................... 250/363.02 |

FOREIGN PATENT DOCUMENTS

| | | |
|---|---|---|
| DE | 2 010 778 | 9/1970 |
| DE | 2 320 852 | 11/1973 |
| DE | 43 01 177 A1 | 7/1994 |
| EP | 0 296 371 A1 | 12/1988 |
| EP | 0 358 413 A1 | 3/1990 |
| EP | 0 387 483 A1 | 9/1990 |
| JP | 56 126 726 A | 10/1981 |

* cited by examiner

Primary Examiner—Steven Loke
Assistant Examiner—Samuel Gebremariam
(74) Attorney, Agent, or Firm—Laurence A. Greenberg; Werner H. Stemer; Ralph E. Locher

(57) ABSTRACT

An ultraviolet light radiation photodetector includes a quartz lens, a UV transmission filter, a silicon photodiode, and a scintillator layer. After passing through the quartz lens and the UV transmission filter, the UV light to be detected is converted in the scintillator layer, preferably applied to the surface on a light-exiting side of the UV transmission filter, into light radiation of a greater wavelength, for which the silicon photodiode exhibits a greater sensitivity. If desired, an additional edge filter can be used to improve the configuration's drop in sensitivity between 350 and 400 nm.

17 Claims, 1 Drawing Sheet

PHOTODETECTOR FOR ULTRAVIOLET LIGHT RADIATION

CROSS-REFERENCE TO RELATED APPLICATION

This application is a continuation of copending International Application No. PCT/DE00/02492, filed Jul. 28, 2000, which designated the United States.

BACKGROUND OF THE INVENTION

Field of the Invention

The invention relates to a photodetector for ultraviolet light radiation.

Realization of highly sensitive UV photodetectors on the basis of silicon photodiodes involves certain difficulties. The difficulties are not so much attributable to the photosensitivity of silicon in the wavelength range <400 nm than attributable to the often necessary suppression of the longer-wave spectrum because it is quite possible by suitable construction of the photodiode to achieve very good quantum efficiencies of >80%. For example, when measuring the UV component in sunlight or monitoring the flame in oil or gas burners, it is required to detect the UV component against a high background of visible light and IR radiation. Because the spectral sensitivity of silicon increases strongly with wavelength in the range of 200 nm to approximately 900 nm, the requirement can only be met by complex filtering measures.

European Patent EP 0 296 371 B1, corresponding to U.S. Pat. No. 4,910,570 to Popovic, and titled "Ultraviolet photodetector and production method," and European Patent Application EP 0 387 483 A1, corresponding to U.S. Pat. No. 5,130,776 to Popovic, and titled "Ultraviolet photodiode," respectively describe a UV photodetector used in the case of the SIEMENS product with the designation "UV Sensor SFH 530". The component is based on the requirement of achieving as high a sensitivity as possible at a wavelength of 310±20 nm, but already reducing it by a factor of 10,000 at 400 nm and in the remaining spectral range to 1100 nm. The attributes are realized by the following construction of the component. A first wavelength selection is brought about by a UV transmission filter, for which the glass filter UG 11 from Schott is used. The still remaining deficiencies in the transmission characteristic of such a filter are corrected by a metal-oxide interference filter, which is vapor-deposited directly onto the silicon photodiode used for the light detection. The photodiode itself is a special configuration having two pn junctions placed one on top of the other. The upper, extremely flat junction is used for the detection, while the lower junction is internally short-circuited. Because the depth of penetration of the light increases greatly with the wavelength, the longer-wave components are in this way effectively suppressed. The component additionally includes an operational amplifier and is installed in a standard metal package, referred to as TO-39, with a quartz lens in the light-entry region.

Such a prior art concept for a UV photodetector has a disadvantage that only a silicon photodiode of the special construction described above can be used as the photodiode. Moreover, the silicon photodiode must be especially prepared by vapor-depositing the metal-oxide interference filter. Both lead to relatively high production costs. In addition, in view of the sensitivity values achieved in the case of other photodetectors in other wavelength ranges, the sensitivity of these conventional UV photodetectors appears to be in need of improvement.

SUMMARY OF THE INVENTION

It is accordingly an object of the invention to provide a photodetector for ultraviolet light radiation that overcomes the hereinafore-mentioned disadvantages of the heretofore-known devices of this general type and that has lower production costs and improved sensitivity values.

With the foregoing and other objects in view, there is provided, in accordance with the invention, an ultraviolet light radiation photodetector, including a semiconductor photodiode for detecting light along a light receiving path, a UV transmission filter disposed upstream of the semiconductor photodiode with respect to the light receiving path, a conversion element disposed between the UV transmission filter and the semiconductor photodiode, the conversion element formed of a conversion material mixed into silicone, the conversion element converting at least a portion of ultraviolet light radiation passing through the UV transmission filter into light radiation having a longer wavelength.

In accordance with another feature of the invention, the conversion material contains a scintillator material, in particular, as customarily used in the production of fluorescent tubes. A prior art scintillator material is produced by OSRAM under the designation "Scintillator L 600" and is of yttrium-vanadate-phosphate-borate:Eu, in particular in the formulaic composition $Y(V, PO_4)_{0.9} (BO_3)_{0.1}$:Eu. Such scintillator material works with a conversion efficiency of the conversion of ultraviolet light radiation into light radiation of a longer wavelength of 80%. The scintillator material has an emission spectrum with a relative maximum at 620 nm. A silicon photodiode has at 600 nm a sensitivity of 0.49 A/W, in comparison with 0.24 A/W at 300 mm. Such characteristics result in a clear increase in sensitivity of the UW photodetector according to the invention.

The scintillator material is preferably mixed into a matrix material, such as silicone. The scintillator material is preferably applied in the form of a layer on the surface on the light-exiting side of the UV transmission filter or on the surface of a possibly additionally present carrier substrate.

If the attenuation of the configuration in the range of 400 to 450 nm is too little, in accordance with a further feature of the invention, the component can be suppressed by a further filter. Suitable, in particular, for such suppression is an edge filter, such as, for example, from Schott with the designation GG 475. If desired, the layer of the scintillator material may then also be applied on the surface on the light-entering side of the edge filter.

In accordance with an added feature of the invention, the edge filter is disposed between the UV transmission filter and the semiconductor photodiode and suppresses at least some of ultraviolet and blue components of light radiation produced by the conversion material.

In accordance with an additional feature of the invention, the UV transmission filter has a light-exiting surface, the conversion element is of a silicone layer into which the conversion material is mixed, and the conversion element is disposed on the light-exiting surface of the UV transmission filter or a carrier substrate.

In accordance with yet another feature of the invention, the conversion element is disposed on the light-exiting surface of the UV transmission filter, the light-entering surface of the edge filter, or a carrier substrate.

In accordance with yet a further feature of the invention, the semiconductor photodiode is a silicon photodiode.

The construction of the configuration can, if desired, take place in the same way as in the case of the prior art detector SFH 530, in which the UV transmission filter is mounted separately from the silicon photodiode in a TO package. However, it is similarly conceivable to mount, in particular, adhesively bond, the UV transmission filter with the applied layer of conversion material directly on the surface of the semiconductor photodiode. Such a unit can then be encapsulated or embedded in a suitable plastic, whereby a finished detector component is produced.

In accordance with yet an added feature of the invention, the semiconductor photodiode has a surface and the UV transmission filter is mounted directly on the surface of the semiconductor photodiode.

In accordance with yet an additional feature of the invention, the UV transmission filter is adhesively bonded directly on the surface of the semiconductor photodiode.

In accordance with again another feature of the invention, the semiconductor photodiode has a surface and the UV transmission filter and the edge filter are mounted directly on the surface of the semiconductor photodiode.

In accordance with again a further feature of the invention, the UV transmission filter and the edge filter are adhesively bonded directly on the surface of the semiconductor photodiode.

In accordance with again an added feature of the invention, there is provided a lens disposed upstream of the UV transmission filter with respect to the light receiving path. Preferably, the lens is of a quartz material.

With the objects of the invention in view, there is also provided an ultraviolet light radiation photodetector including a semiconductor photodiode for detecting light along a light receiving path, a UV transmission filter disposed upstream of the semiconductor photodiode with respect to the light receiving path, a conversion element disposed between the UV transmission filter and the semiconductor photodiode, the conversion element having conversion material and converting at least a portion of ultraviolet light radiation passing through the UV transmission filter into light radiation having a longer wavelength, and an edge filter disposed between the UV transmission filter and the semiconductor photodiode, the edge filter suppressing some of ultraviolet and blue components of light radiation produced by the conversion material.

In accordance with a concomitant feature of the invention, the conversion element is of a silicone layer into which the conversion material is mixed and the conversion element is disposed on the light-exiting surface of the UV transmission filter, the light-entering surface of the edge filter, or a carrier substrate.

Other features that are considered as characteristic for the invention are set forth in the appended claims.

Although the invention is illustrated and described herein as embodied in a photodetector for ultraviolet light radiation, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
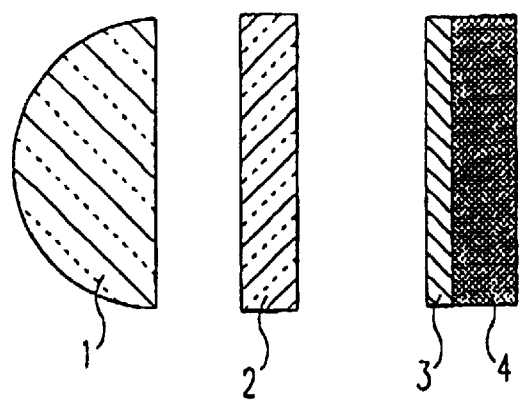
FIG. 1 is a exploded, cross-sectional view of the components of a conventional UV photodetector.

Referring now to the figures of the drawings in detail and first, particularly to FIG. 1 thereof, there is shown a conventional UV photodetector having on the light-entering side a quartz lens 1, by which the incident radiation is to be focused. With a UV transmission filter 2, a first wavelength selection is then performed. A glass filter UG 11 from Schott, for example, is used for such purpose. A second wavelength selection is then performed with a metal-oxide interference filter 3. The filter 3 is vapor-deposited directly onto the silicon photodiode 4. As already described at the beginning, the silicon photodiode 4 has been prepared in a special way for the specific intended application.

Figure 2:
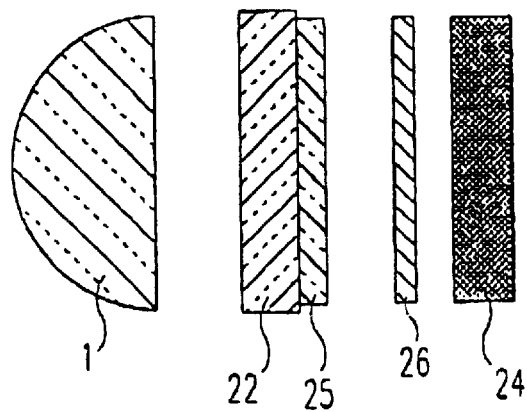
FIG. 2 is an exploded, cross-sectional view of the components of a UV photodetector according to the invention.

In the case of the exemplary embodiment according to the invention as shown in FIG. 2, firstly, as in the prior art, a first wavelength selection is performed by a UV transmission filter 22, such as the filter types Schott UG 11 or DUG 11 X (improved version). Then, however, the UV radiation is absorbed and converted into light radiation of a longer wavelength, for example, in the green or red spectral range, by wavelength conversion through a suitable conversion material. A scintillator material, as customarily used in fluorescent tubes to convert the UV radiation emitted there by the fluorescent gas into radiation in the visible wavelength range, can be used as the conversion material. An example of the material is the scintillator L 600 from OSRAM, which, when excited by UV light radiation, has an emission spectrum at approximately 620 nm, that is, in the red spectral range, has a relatively narrow emission band. The scintillator, which is generally in the form of fine powder, can, for example, be mixed into a carrier material such as silicone and can be applied as a scintillator layer 25 directly to the UV transmission filter 22. If appropriate, an epoxy resin may also be used as the carrier material for the scintillator, although in such a case a lower transparency and resistance to UV radiation must be expected in comparison with silicone.

A standard photodiode, which can be produced at significantly lower cost and presents fewer problems technologically than the prepared semiconductor photodiode used in the prior art, can be used as the semiconductor photodiode 24.

Instead of the use of a metal interference filter as in the prior art, a customary edge filter 26, for example, Schott GG 475, can also be used in the exemplary embodiment according to the invention of FIG. 2 for the attenuation in the range of 400 to 450 nm. Such a filter improves the drop in sensitivity of the configuration between 350 and 400 nm. In an alternative variant, the conversion material is not applied to the surface on the light-exiting side of the UV filter 22 but to the surface on the light-entering side of the edge filter 26, if present.

It may also be provided that the conversion material is applied in the form of a layer to a carrier that is additionally present and is located between the UV transmission filter 22 and the semiconductor photodiode 24 or between the UV transmission filter 22 and the edge filter 26, if present.

The elements described can be installed together with a quartz lens 1 and an operational amplifier into a standard TO package.

I claim:

1. An ultraviolet light radiation photodetector, comprising:
   a semiconductor photodiode for detecting light along a light receiving path;
   an ultraviolet transmission filter disposed upstream of said semiconductor photodiode with respect to the light receiving path;
   a conversion element disposed between said UV ultraviolet transmission filter and said semiconductor photodiode, said conversion element formed of a conversion material mixed into silicone, said conversion element converting at least a portion of ultraviolet light radiation passing through said ultraviolet transmission filter into light radiation having a longer wavelength.

2. The photodetector according to claim 1, wherein said conversion material contains a scintillator material.

3. The photodetector according to claim 2, wherein said scintillator material is yttrium-vanadate-phosphate-borate: Eu.

4. The photodetector according to claim 3, wherein said yttrium-vanadate-phosphate-borate:Eu is in the formulaic composition $Y(V,PO_4)_{0.9} (BO_3)_{0.1}$:Eu.

5. The photodetector according claim 1, including an edge filter disposed between said ultraviolet transmission filter and said semiconductor photodiode, said edge filter suppressing ultraviolet and blue components of light radiation produced by said conversion material.

6. The photodetector according claim 1, including an edge filter disposed between said ultraviolet transmission filter and said semiconductor photodiode, said edge filter Suppressing some of ultraviolet and blue components of light radiation produced by said conversion material.

7. The photodetector according to claim 1, wherein:
   said ultraviolet transmission filter has a light-exiting surface;
   said conversion element is of a silicone layer into which said conversion material is mixed; and
   said conversion element is disposed on at least one of:
      said light-exiting surface of said ultraviolet transmission filter; and
      a carrier substrate.

8. The photodetector according to claim 6, wherein:
   said edge filter has light-entering surface;
   said ultraviolet transmission filter has a light-exiting surface;
   said conversion element is of a silicone layer into which said conversion material is mixed; and
   said conversion element is disposed on at least one of:
      said light-exiting surface of said ultraviolet transmission filter;
      said light-entering surface of said edge filter; and
      a carrier substrate.

9. The photodetector according to claim 1, wherein said semiconductor photodiode is a silicon photodiode.

10. The photodetector according to claim 1, wherein:
    said semiconductor photodiode has a surface; and
    said ultraviolet transmission filter is mounted directly on said surface of said semiconductor photodiode.

11. The photodetector according to claim 10, wherein said ultraviolet transmission filter is adhesively bonded directly on said surface of said semiconductor photodiode.

12. The photodetector according to claim 6, wherein:
    said semiconductor photodiode has a surface; and
    said ultraviolet transmission filter and said edge filter are mounted directly on said surface of said semiconductor photodiode.

13. The photodetector according to claim 12, wherein said ultraviolet transmission filter and said edge filter are adhesively bonded directly on said surface of said semiconductor photodiode.

14. The photodetector according to claim 1, including a lens disposed upstream of said ultraviolet transmission filter with respect to the light receiving path.

15. The photodetector according to claim 14, wherein said lens is of a quartz material.

16. An ultraviolet light radiation photodetector, comprising:
    a semiconductor photodiode for detecting light along a light receiving path;
    an ultraviolet transmission filter disposed upstream of said semiconductor photodiode with respect to the light receiving path;
    a conversion element disposed between said ultraviolet transmission filter and said semiconductor photodiode, said conversion element having conversion material and converting at least a portion of ultraviolet light radiation passing through said ultraviolet transmission filter into light radiation having a longer wavelength; and
    an edge filter disposed between said ultraviolet transmission filter and said semiconductor photodiode, said edge filter suppressing some of ultraviolet and blue components of light radiation produced by said conversion material.

17. The photodetector according to claim 16, wherein:
    said edge filter has light-entering surface;
    said ultraviolet transmission filter has a light-exiting surface;
    said conversion element is of a silicone layer into which said conversion material is mixed; and
    said conversion element is disposed on at least one of:
       said light-exiting surface of said ultraviolet transmission filter;
       said light-entering surface of said edge filter; and
       a carrier substrate.

* * * * *

UNITED STATES PATENT AND TRADEMARK OFFICE
CERTIFICATE OF CORRECTION

PATENT NO. : 6,713,795 B2
DATED : March 30, 2004
INVENTOR(S) : Werner Kuhlmann

It is certified that error appears in the above-identified patent and that said Letters Patent is hereby corrected as shown below:

<u>Title page,</u>
Item [63], Related U.S. Application Data, should read as follows:
-- Continuation of applic. No. PCT/DE00/02492, filed on July 28, 2000 --

Signed and Sealed this

Third Day of August, 2004

JON W. DUDAS
*Acting Director of the United States Patent and Trademark Office*